United States Patent
Hwang et al.

(10) Patent No.: US 9,589,992 B2
(45) Date of Patent: Mar. 7, 2017

(54) DISPLAY PANEL INCLUDING STATIC ELECTRICITY PREVENTING PATTERN AND DISPLAY DEVICE HAVING THE SAME

(71) Applicant: LG DISPLAY CO., LTD., Seoul (KR)

(72) Inventors: SoonJae Hwang, Paju-si (KR); DuHwan Oh, Sejong (KR); HwaDong Han, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/941,064

(22) Filed: Nov. 13, 2015

(65) Prior Publication Data

US 2016/0190119 A1    Jun. 30, 2016

(30) Foreign Application Priority Data

Dec. 29, 2014 (KR) .......................... 10-2014-0192171

(51) Int. Cl.
*H01L 27/02* (2006.01)
*H01L 27/12* (2006.01)

(52) U.S. Cl.
CPC ........ *H01L 27/124* (2013.01); *H01L 27/0288* (2013.01); *H01L 27/0296* (2013.01)

(58) Field of Classification Search
CPC ............... H01L 27/0292; H01L 27/124; H01L 27/0207; H01L 27/1463; H01L 27/14612; H01L 27/14609; H01L 27/3262; H01L 27/326; H01L 27/3248; H01L 27/3244; H01L 27/32; H01L 27/3276; H01L 27/3297

USPC ......... 257/48, 72; 349/40, 152; 438/30, 149, 438/479, 517
See application file for complete search history.

(56) References Cited

U.S. PATENT DOCUMENTS

| | | | | |
|---|---|---|---|---|
| 6,906,773 | B2 * | 6/2005 | Choi | G02F 1/1339 349/153 |
| 7,477,332 | B2 * | 1/2009 | Park | G02F 1/136204 349/40 |
| 7,643,121 | B2 * | 1/2010 | Choi | G02F 1/1345 349/149 |
| 8,368,074 | B2 * | 2/2013 | Koo | H01L 29/786 257/232 |
| 8,531,617 | B2 * | 9/2013 | Kim | G02F 1/1345 349/152 |
| 9,331,135 | B2 * | 5/2016 | Pang | H01L 27/3276 |
| 2004/0125308 | A1 * | 7/2004 | Park | G02F 1/136204 349/149 |
| 2004/0125314 | A1 * | 7/2004 | Choi | G02F 1/1339 349/153 |
| 2008/0106661 | A1 * | 5/2008 | Kim | G02F 1/1345 349/40 |
| 2011/0186844 | A1 * | 8/2011 | Koo | H01L 29/786 257/59 |
| 2014/0139413 | A1 * | 5/2014 | Kwon | G09G 3/3208 345/82 |

(Continued)

*Primary Examiner* — Earl Taylor
(74) *Attorney, Agent, or Firm* — Birch, Stewart, Kolasch & Birch, LLP

(57) ABSTRACT

The present invention relates to a display panel including a static electricity preventing pattern and a display device having the same. An aspect of the present invention provides a display device or a display panel in which a dummy pattern having a pattern identical to or similar to a line of a signal area is positioned between the signal area and a non-signal area, in a pad including the signal area and the non-signal area.

16 Claims, 13 Drawing Sheets

(56) References Cited

U.S. PATENT DOCUMENTS

2015/0144911 A1\* 5/2015 Pang .................. H01L 51/5246
　　　　　　　　　　　　　　　　　　　　　　257/40
2015/0153779 A1\* 6/2015 Ko ....................... G06F 1/1652
　　　　　　　　　　　　　　　　　　　　　　345/173

\* cited by examiner

DISPLAY PANEL INCLUDING STATIC ELECTRICITY PREVENTING PATTERN AND DISPLAY DEVICE HAVING THE SAME

CROSS-REFERENCE TO RELATED APPLICATION

This application claims priority from and the benefit under 35 U.S.C. §119(a) of Korean Patent Application No. 10-2014-0192171, filed on Dec. 29, 2014, which is hereby incorporated by reference for all purposes as if fully set forth herein.

BACKGROUND OF THE INVENTION

1. Field of the Invention

The present invention relates to a display device including a static electricity preventing pattern.

2. Description of the Related Art

As the information society develops, display devices for displaying an image are being increasingly required in various forms, and in recent years, various display devices such as Liquid Crystal Displays (LCDs), Plasma Display Panels (PDPs), and Organic Light Emitting Display Devices (OLEDs) have been utilized. Such a display device includes a display panel corresponding to the display device.

Such a display panel includes a non-active area where a pad for applying a signal to the outside thereof is formed, and an active area where a pixel or a subpixel is formed. Meanwhile, in a pad formed in the non-active area, a line connected to a gate line or a data line in the active area, and lines connected between the pads are disposed. However, when shapes of lines are different (e.g., when the shapes of neighbouring lines are different), static electricity may occur between the lines. Specifically, when static electricity occurs in a line connected to the data line or the gate line, damage may occur in a thin film transistor connected thereto. Thus, a technique for removing or minizing damage by the static electricity applied to the transistor in the display panel is needed.

SUMMARY OF THE INVENTION

An aspect of the present invention is to provide a display panel and a display device in which a dummy pattern for preventing a rapid change of lines in a pad area is disposed.

Another aspect of the present invention is to prevent damage of a transistor in a display panel, due to static electricity, by generating the static electricity owing to a difference of patterns of lines in a pad area, in a dummy pattern.

Another aspect of the present invention is to block static electricity due to a difference of patterns of lines between the outside of an active area and the inside of the active area, by connecting a dummy pattern to a line outside the active area.

An aspect of the present invention provides a display device or a display panel in which a dummy pattern having a pattern identical to or similar to a line of a signal area is positioned between the signal area and a non-signal area, in a pad including the signal area and the non-signal area.

Another aspect of the present invention provides a display device or a display panel in which a dummy pattern positioned on a signal area and a non-signal area of a pad is extended and disposed on the outside of an active area.

Another aspect of the present invention provides a display device or a display panel in which a dummy pattern is positioned between a signal area and a non-signal area of a pad to block static electricity by the dummy pattern, which is transmitted from the outside to a line of the signal area.

As described above, according to the embodiment of the present invention, since a rapid change of lines between a signal area and a non-signal area in a pad area is prevented by a dummy pattern, a display panel and a display device in which a line of the signal area is securely protected can be provided.

In addition, according to the embodiment of the present invention, since a dummy pattern is disposed between a signal area and a non-signal area of a pad, and the dummy pattern is extended and disposed on the outside of an active area, damage of a transistor positioned on a boundary of the active area can be minimized or prevented.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1:
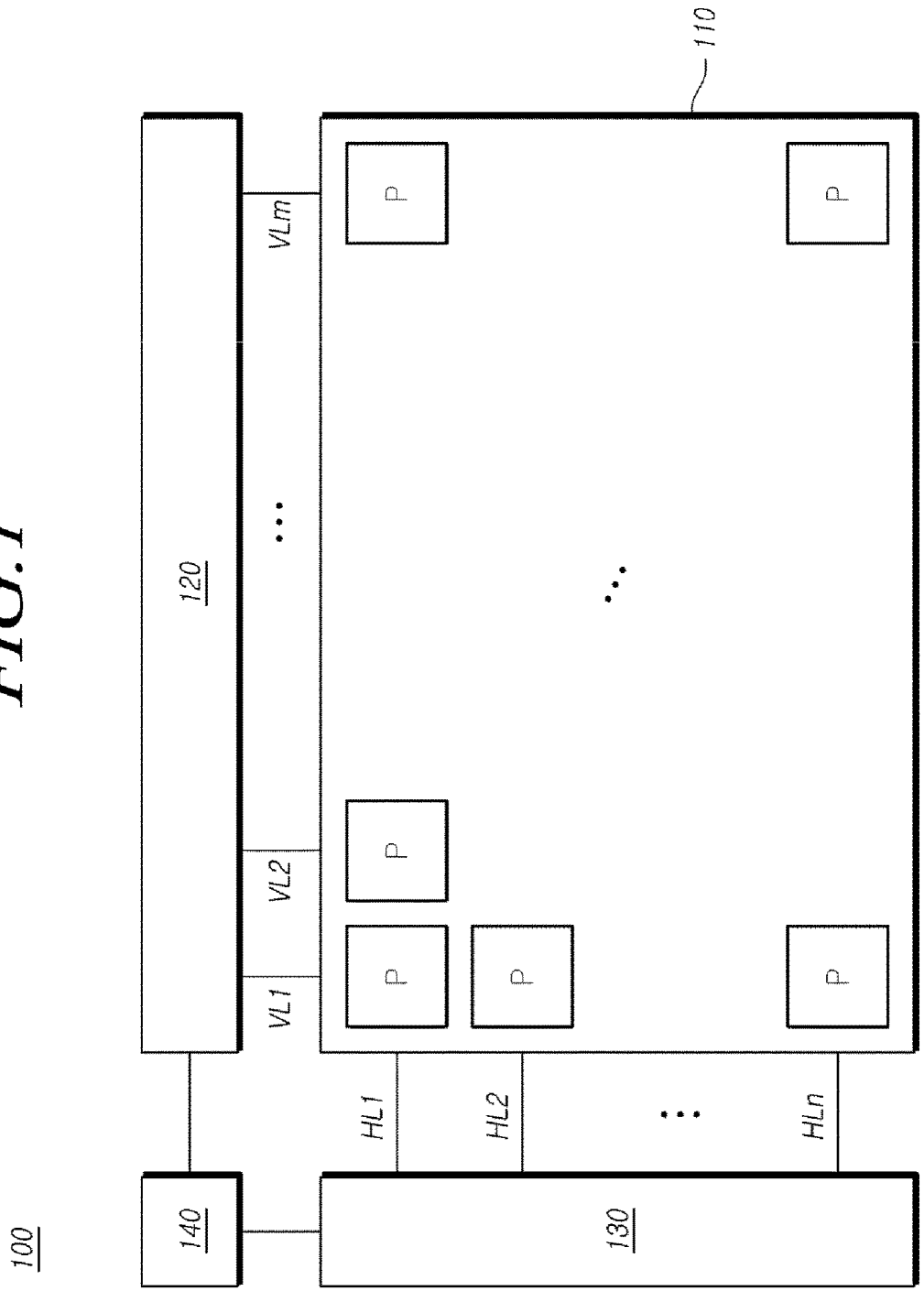
FIG. 1 is a schematic view illustrating a display device according to embodiments of the present invention.

Hereinafter, embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a schematic view illustrating a display device according to embodiments of the present invention. All the components of the display device in this and other embodiments are operatively coupled and configured.

Referring to FIG. 1, a display device 100 according to embodiments includes a display panel 110 in which a plurality of first lines VL1 to VLm are formed in a first direction (for example, a vertical direction) and a plurality of second lines HL1 to HLn are formed in a second direction (for example, a horizontal direction), a first driving unit 120 for supplying a first signal to the plurality of first lines VL1 to VLm, a second driving unit 130 for supplying a second signal to the plurality of second lines HL1 to HLn, and a timing controller 140 for controlling the first driving unit 120 and the second driving unit 130.

A plurality of pixels P are defined in the display panel 110 as the plurality of first lines VL1 to VLm formed in the first direction (for example, a vertical direction) and the plurality of second lines HL1 to HLn formed in the second direction (for example, a horizontal direction) cross each other.

Each of the above-mentioned first driving unit 120 and second driving unit 130 may include at least one driving integrated circuit outputting a signal for an image display.

The plurality of first lines VL1 to VLm formed in the display panel 100 in the first direction may be, for example, data lines formed in the vertical direction (first direction), for transferring a data voltage (first signal) to vertical rows of pixels, and the first driving unit 120 may be a data driving unit for supplying a data voltage to the data lines.

In addition, the plurality of second lines HL1 to HLn formed in the display panel 110 in the second direction may be gate lines formed in the horizontal direction (second direction), for transferring a scan signal (first signal) to horizontal rows of pixels, and the second driving unit 130 may be a gate driving unit for supplying a scan signal to the gate lines.

In addition, a pad part is configured in a display panel 110 in order to access the first drive unit 120 and the second drive unit 130. The pad part transfers the first signal to the display panel 110 when the first drive unit 120 provides the first signal to the plurality of first lines VL1 to VLm. In the same manner, the pad part transfers the second signal to the display panel 110 when the second drive unit 130 provides the second signal to the plurality of second lines HL1 to HLn.

An element supplying power and a signal is combined to an edge of the display panel 110. In order to apply a signal to a thin film transistor formed in each pixel of the display panel 110, a plurality of pads is formed in the edge of the display panel 110.

Figure 2:
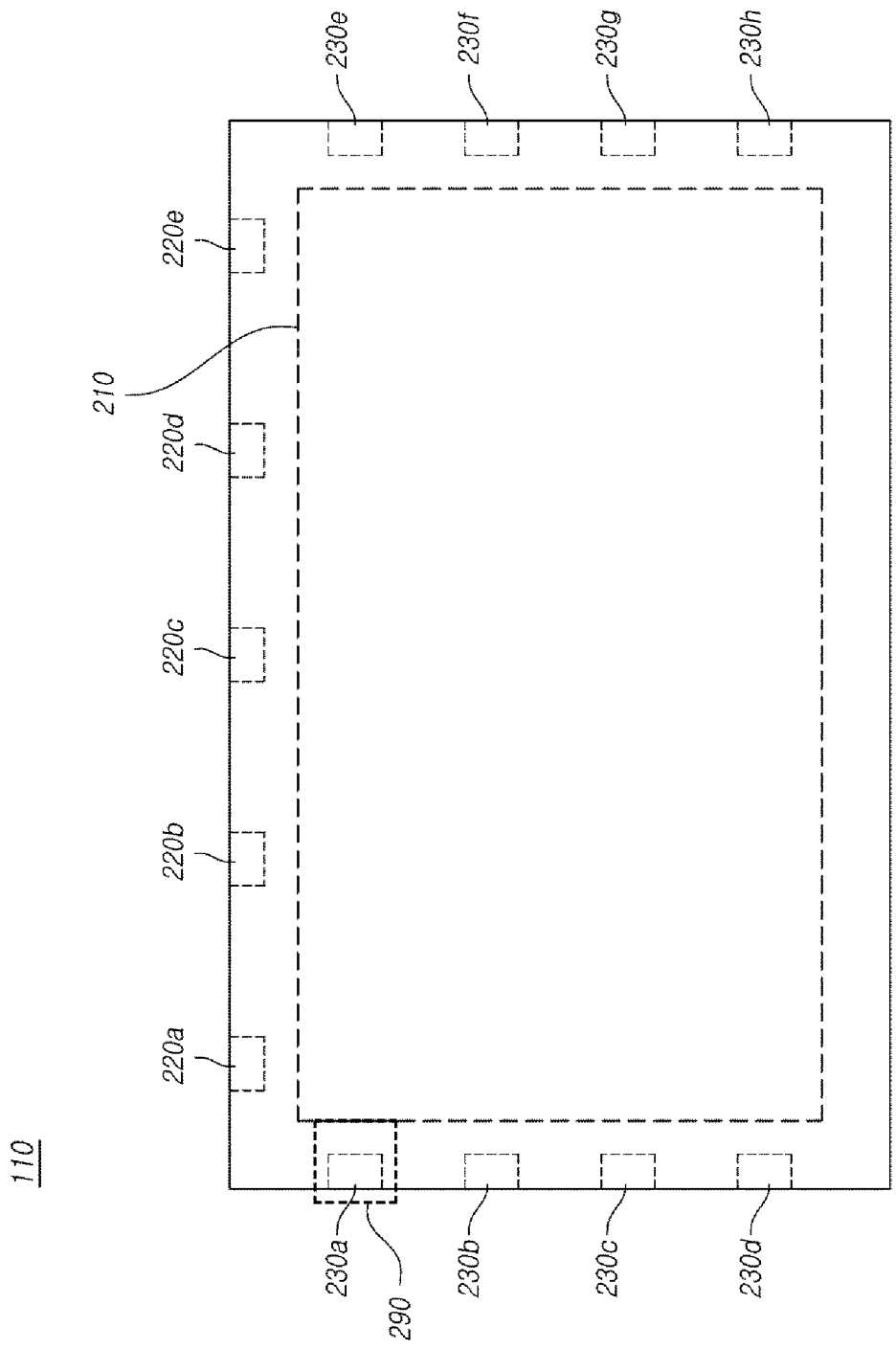
FIGS. 2 and 3 are views illustrating a display panel to which an embodiment of the present invention is applied.
Figure 3:
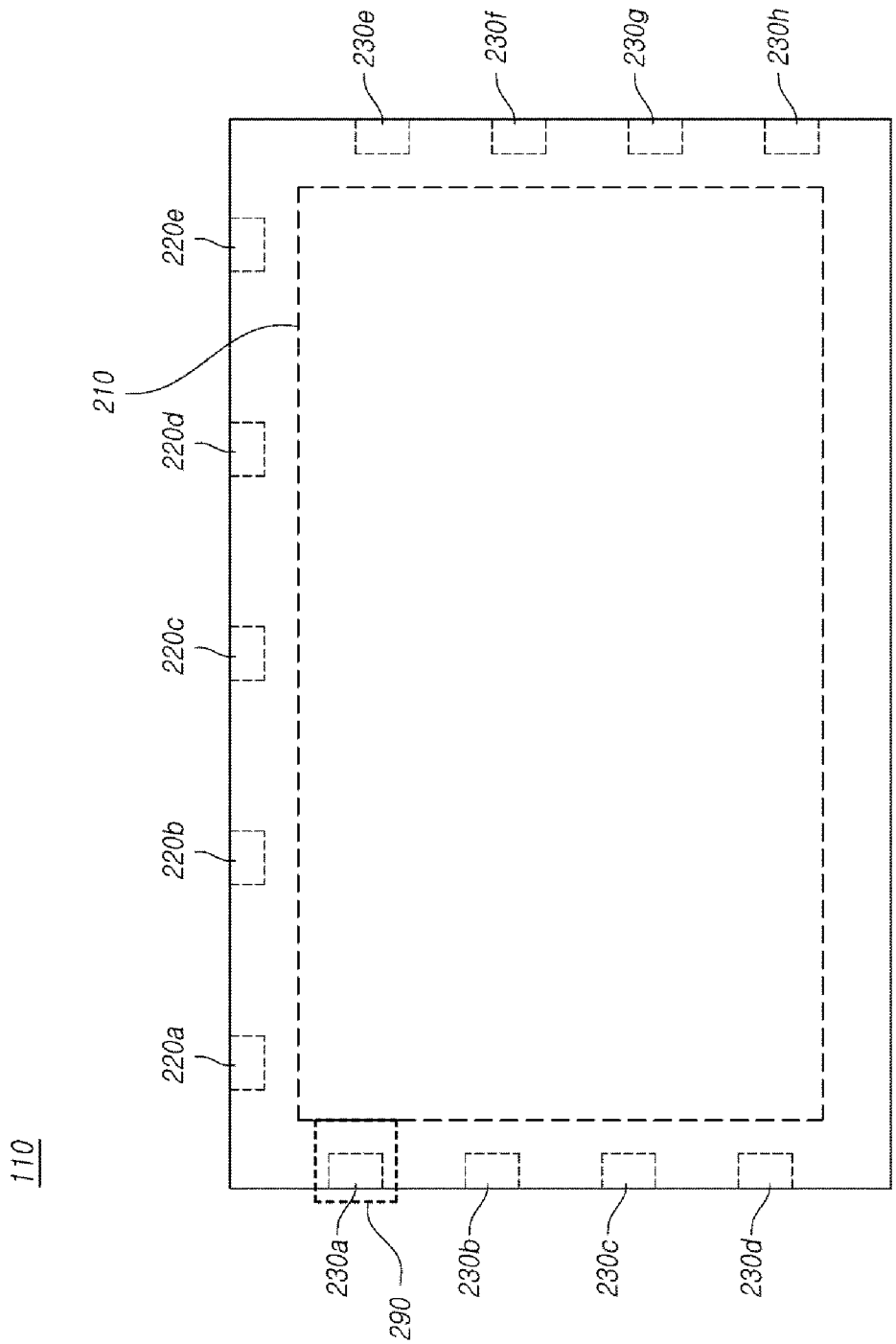

FIGS. 2 and 3 are views illustrating the display panel 110 to which an embodiment of the present invention is applied. An active area 210 may be positioned in a central area of the display panel 110, and a plurality of pads 220 and 230 may be formed around the active area 210. For convenience of description, pads 230a to 230h receiving a signal from the second driving unit 130 or the gate driving unit, which are shown in FIGS. 2 and 3, are referred to as gate pads. In FIGS. 2 and 3, the gate pads 230a to 230h are positioned on both sides of the display panel 110, but the present invention is not limited thereto, and the gate pads 230a to 230h may be disposed on one side of the display panel 110. Pads 220a to 220e receiving a signal from the first driving unit 120 or the data driving unit of FIG. 1 are referred to as data pads. The number of the data pads 220a to 220e or the number of the gate pads 230a to 230h may be changed according to the size, a circuit structure of the display panel 110, and the like. In addition, the gate pads 230a to 230d of one side and the gate pads 230e to 230h of another side may face each other. The gate pads 230a to 230d of one side and the gate pads 230e to 230h of the other side may be connected to the same gate line (e.g., a sensing line and a scanning line), or may be each gate line (e.g., sensing line and scanning line). In FIG. 2, the gate pad 230a and the gate pad 230e are connected to the same gate line, the gate pad 230b and the gate pad 230f are connected to the same gate line, the gate pad 230c and the gate pad 230g are connected to the same gate line, and the gate pad 230d and the gate pad 230h are connected to the same gate line.

According to an embodiment, a Flexible Flat Cable (FFC) or a Flexible Printed Circuit (FPC) may be configured to connect the data pad 220 to the first driving unit 120.

Figure 4:
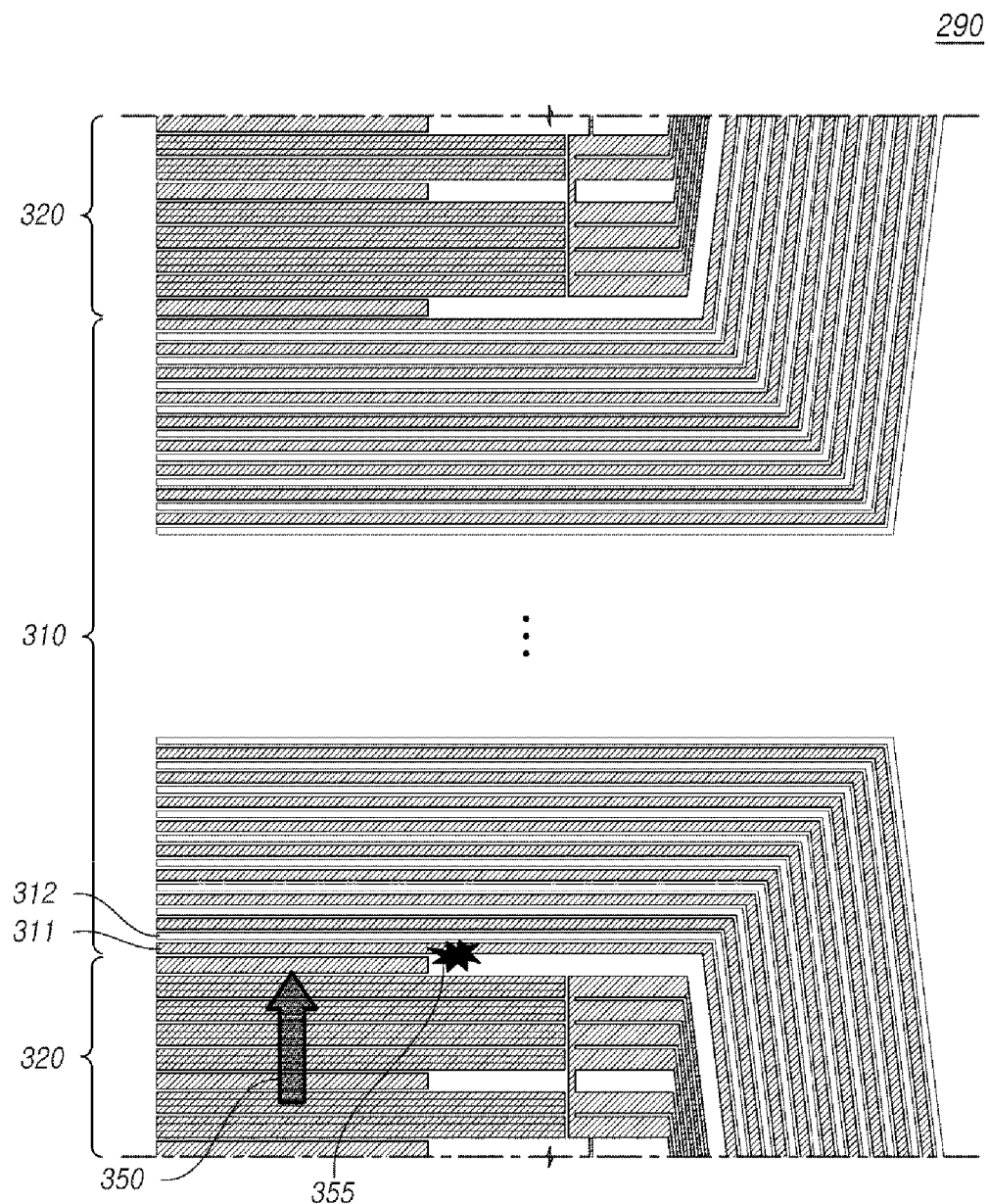
FIG. 4 is a view illustrating a configuration of signal lines of a gate pad area according to an embodiment of the present invention.

As shown in FIG. 2, the pads 220 and 230 are positioned in a non-active area except for (in other words, outside of) the active area 210 of the display panel. A signal line formed in the pads 220 and 230 may be a line of a signal applied to each pixel. FIG. 4 is an enlarged view of a portion 290 including the gate pad of FIG. 2.

FIG. 3 illustrates a case in which the gate pads 230a to 230d of one side and the gate pads 230e to 230h of the other side are connected to each gate line (e.g., sensing line and scanning line), differently from FIG. 2.

FIG. 4 is a view illustrating a configuration of signal lines of a gate pad area. A reference numeral 310 indicates a signal area where lines applying signals to the display panel 110 are formed. According to an embodiment, a sensing line 311 for sensing and a scanning line 312 for scanning may be alternately positioned. The sensing line 311 and the scanning line 312 may be inversely disposed. That is, the reference numeral 311 may be the scanning line, and the reference numeral 312 may be the sensing line. The present invention is applied to both embodiments in which the outermost line of the signal area in the gate pad area is the scanning line or the sensing line. The sensing line controls a sensing thin film transistor for compensation. The scanning line controls a driving thin film transistor.

Meanwhile, an area 320 indicates a non-signal area where a line through which a signal is not applied to the display panel is formed. The line is a line formed for EVDD and EVSS to be transferred to an adjacent pad, and may be connected to the adjacent pad. When the signal area 310 and the non-signal area 320 are compared, since roles of the lines are different, patterns of the lines in the signal area 310 and the non-signal area 320 are different. In this case, a change occurs in a pattern of a line shown as a reference numeral 350 in a boundary of the signal area 310 and the non-signal area 320, and thus static electricity 355 may occur. For example, when friction is applied from the outside in a direction 350, the static electricity occurs in an area where the pattern of the line changes. That is, according to a gate pad area as an embodiment, when a rapid change occurs in shapes of a pattern of a line (i.e., a line of the non-signal area) which does not apply a signal to the panel and a pattern of a line (i.e., a line of the signal area) which applies a signal to the panel, a defect due to the static electricity may occur. Specifically, the static electricity may occur in the outermost edge line of the signal area which is adjacent to the line of the non-signal area. For example, the static electricity 355 may damage a sensing transistor connected to a first sensing line 311 which is the outermost edge line of the signal line. Therefore, the present invention provides a static electricity barrier for the line of the signal area when the static electricity occurs, by adding at least one dummy pattern having a similar shape. In addition, the present invention can resolve a defect due to the static electricity by adding the dummy pattern.

Figure 5:
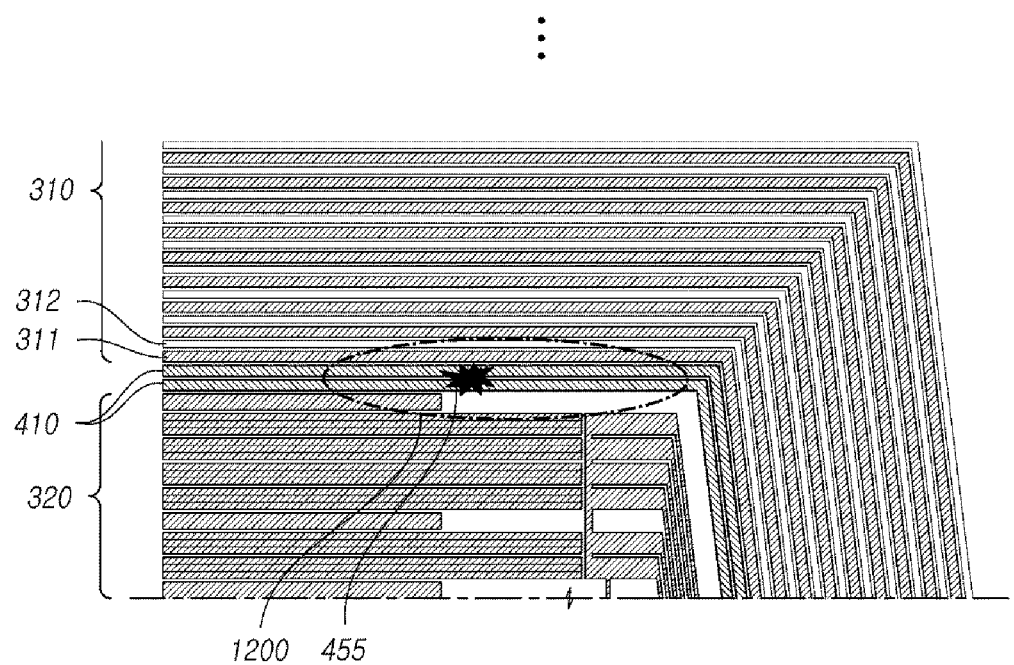
FIG. 5 is a view illustrating a dummy pattern formed between a line of a signal area and a line of a non-signal area according to an embodiment of the present invention.

FIG. 5 is a view illustrating a dummy pattern formed between a line of a signal area and a line of a non-signal area according to an embodiment of the present invention.

In a pad area, a dummy pattern 410 is formed between an area 310 where a line (hereinafter, referred to as a panel line) of a signal area is formed and an area 320 where a line (hereinafter, referred to as non-panel line) of a non-signal area is formed. The dummy pattern 410 is formed in a shape identical to that of the panel line. When friction occurs in a direction from the non-panel line to the panel line, static electricity 455 occurs in the dummy pattern 410 instead of a first panel line 311. Since the dummy pattern 410 is not connected to a transistor controlling a pixel in a panel, even if the static electricity occurs in the dummy pattern 410, the static electricity does not influence an operation of the transistor related to the pixel, and thus the transistor of an active area is protected from the static electricity. The dummy pattern 410 has a shape identical to or similar to that of the first panel line 311 so as not to generate static electricity when friction occurs from the dummy pattern 410 to the first panel line 311. As described above, when a pad is a gate pad, the dummy pattern blocks static electricity which may occur in a sensing line or a scanning line positioned on the outermost edge of the active area, and thus prevents damage of a sensing thin film transistor or a driving thin film transistor. In FIGS. 6 to 9 described later, a sensing line or a scanning line may be positioned on the outermost edge of an active area, and a dummy pattern is disposed with a pattern identical to or similar to that of the sensing line or the scanning line adjacently to the sensing line or the scanning line. Therefore, static electricity occurs in only the dummy pattern, the scanning line or the sensing line is prevented from the static electricity, and thus damage of a sensing thin film transistor or a driving thin film transistor is prevented.

Although FIG. 5 is described based on a gate line, the present invention may be applied to a data line. To sum up, at least one first pad and at least one second pad are positioned outside of the active area where a plurality of pixels driven through a thin film transistor controlled by the data lines VL1, . . . , and VLm, the gate line HL1, . . . , and HLn shown in FIG. 1 are positioned. A first pad includes a signal area where a line connected to the data line is positioned and a non-signal area where a line disconnected from the data line is positioned (i.e., which comprises one or more lines which are not connected to the data line). Here, the non-signal area is outside of the signal area. A second pad includes a signal area where a line connected to the data line is positioned and a non-signal area where a line disconnected from the data line is positioned. Here, the non-signal area is outside of the signal area. In addition, as shown in FIG. 5, the dummy pattern 410 may be positioned between the signal area and the non-signal area in at least one of the first pad and the second pad. The dummy pattern blocks an occurrence of a static electricity in the line of the signal area, which occurs in the signal area when friction occurs from the non-signal area to the signal area. A dummy pattern may be understood as a pattern of one or more lines wherein the lines are dummy lines, e.g., are free of signal transmission functionality. Therefore, damage due to static electricity does not occur in a thin film transistor of an active area, which is connected to the line of the signal line, and thus stability of a display panel or a display device is improved. Specially, since a possibility in which friction from the non-signal area to the signal area is high, during processing of a product and after the product is released, the dummy pattern which is not connected to the pixel of the display panel can provide an effect in which the thin film transistor of the pixel is not damaged even if static electricity due to the friction occurs.

Hereinafter, various embodiments for forming a dummy pattern in a pad area are described. The dummy pattern may be variously configured according to an area where a pad is positioned. In the embodiment of FIG. 2 or FIG. 3, in a pad area such as the gate pad 230d, 230h, 230a or 230e among the gate pads 230, which are positioned on the edge, a dummy pattern for preventing static electricity occurring in a direction from the outside of the active area 210 to the inside of the active area 210 other than static electricity occurring in the pad area may be disposed. As an embodiment, a dummy pattern formed in the gate pads 230d and 230h is described with reference to FIGS. 6 to 9. FIG. 2 illustrates a case in which the gate pads 230d and 230h of both sides control the same gate line. FIG. 3 illustrates a case in which the gate pads 230d and 230h of both sides control different gate lines.

Figure 6:
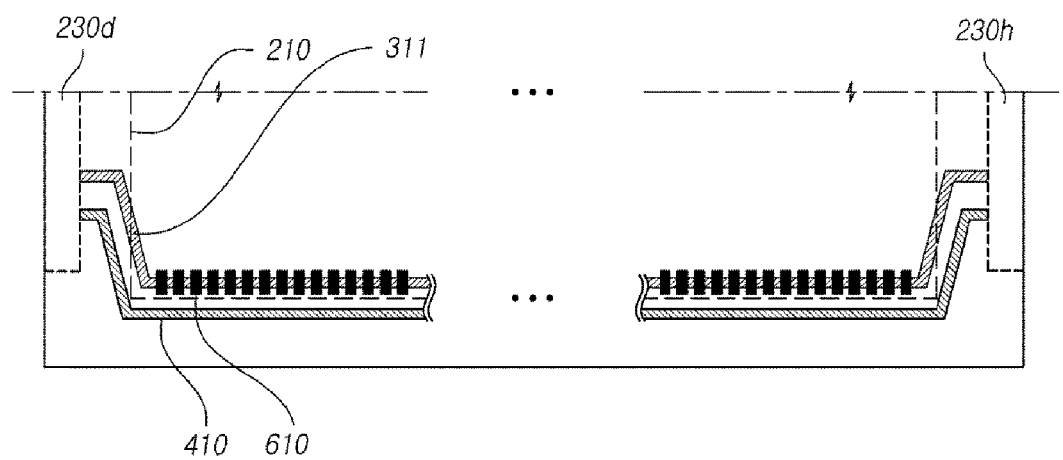
FIG. 6 is a view illustrating a dummy pattern of the outermost pad according to an embodiment of the present invention.

FIG. 6 is a view illustrating a dummy pattern of the outermost pad according to an embodiment of the present invention. The gate pads 230d and 230h of FIG. 2 and the dummy pattern formed in the gate pad are described. The gate pads 230d and 230h of FIG. 2 face each other and apply a signal to the same gate line (e.g., sensing line and scanning line). Meanwhile, the gate pads 230d and 230h of FIG. 2 are positioned on the outermost area of the active area 210.

A transistor 610 is formed in the active area 210 on a line 311 which is positioned on the outermost area, among lines forming the outermost gate pads 230d and 230h. In addition, the dummy pattern 410 is positioned on the outer area. Since the gate pads 230d and 230h are positioned on the outermost area, the dummy pattern 410 covers the outermost line 311 and is connected between both gate pads 230d and 230h.

Figure 7:
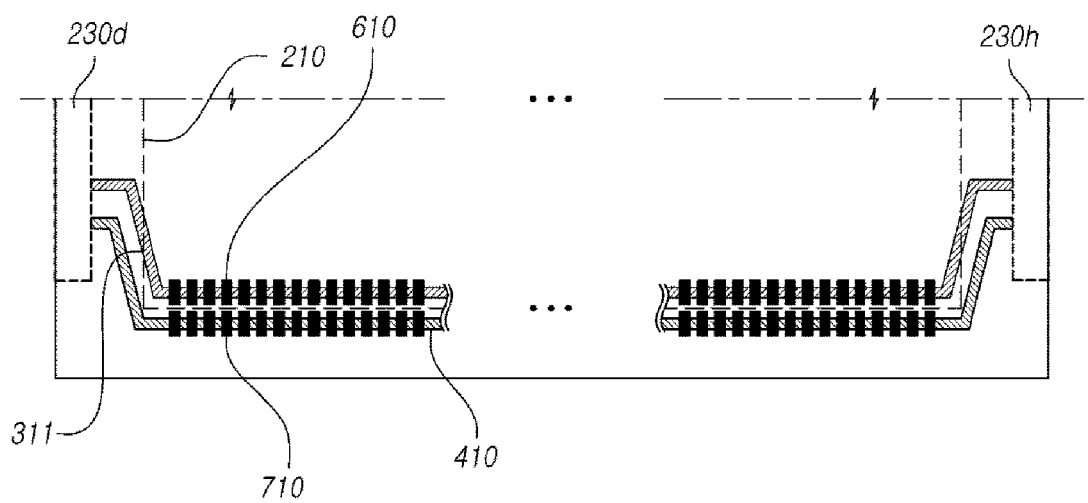
FIG. 7 is a view illustrating a dummy pattern of the outermost pad according to another embodiment of the present invention.

FIG. 7 is a view illustrating a dummy pattern of the outermost pad according to another embodiment of the present invention. The transistor 610 is formed in the active area 210 on the line 311 which is positioned on the outermost area, among the lines forming the outermost gate pads 230d and 230h. Since the dummy pattern 410 is formed in the outer area and the gate pads 230d and 230h are positioned on the outermost area, the dummy pattern 410 covers the outermost line 311 and is connected between both gate pads 230d and 230h. In addition, in order to protect the transistor 610 in the active area 210, a dummy transistor 710 may be further formed in a shape identical to or similar to that of the transistor 610 of the most outer line 311.

Figure 8:
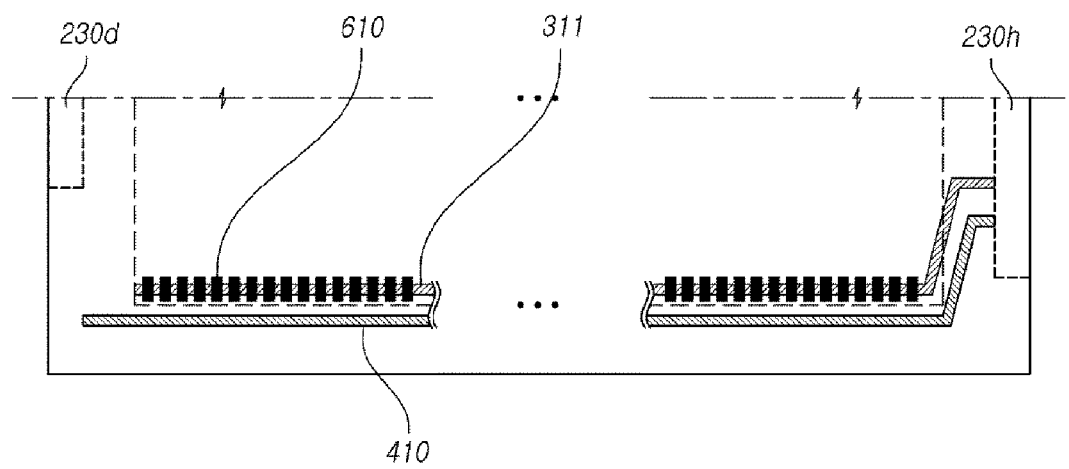
FIG. 8 is a view illustrating a dummy pattern of the outermost pad according to another embodiment of the present invention.
Figure 9:
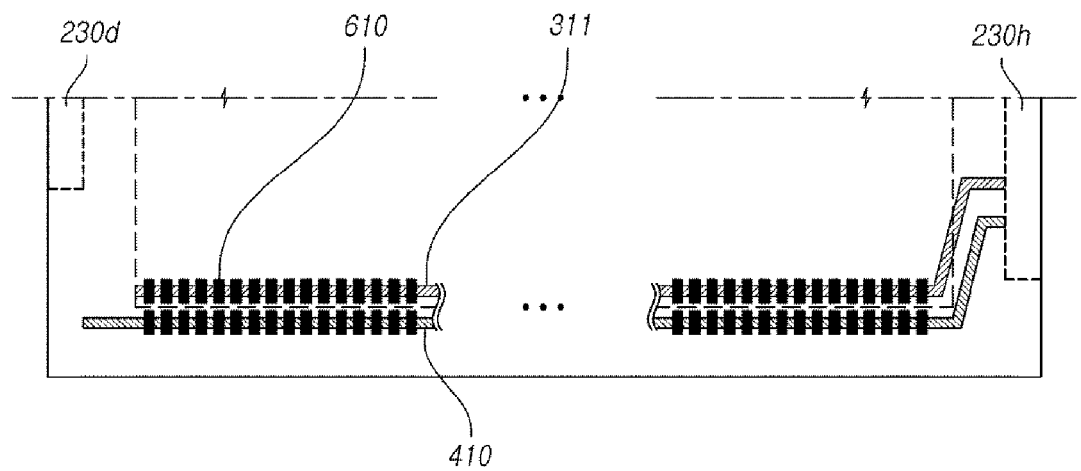
FIG. 9 is a view illustrating a dummy pattern of the outermost pad according to another embodiment of the present invention.

FIGS. 6 and 7 illustrate a configuration of the dummy pattern passing through the outer area of the active area in forming the dummy pattern positioned on the outer area. FIGS. 8 and 9 are views illustrating a configuration in which the dummy pattern is formed in the outer area of the active area and is not connected to the pad area in the configuration of FIG. 3.

FIG. 8 is a view illustrating a dummy pattern of the outermost pad according to another embodiment of the present invention. The gate pad 230h of FIG. 3 and the dummy pattern formed in the gate pad are described. The gate pad 230h of FIG. 3 is positioned on the outermost area of the active area 210, and applies a signal to the gate line (e.g., sensing line and scanning line). Meanwhile, the gate pad 230h of FIG. 3 is positioned on the outermost area of the active area 210. The transistor 610 is formed in the active area 210 on the line 311 which is positioned on the outermost area, among lines forming the outermost gate pad 230h. In addition, the dummy pattern 410 is formed in the outer area. Since the gate pad 230h is positioned on the outermost area, the dummy pattern 410 covers the outermost line 311 and is formed outside of the active area 210.

FIG. 9 is a view illustrating a dummy pattern of the outermost pad according to another embodiment of the present invention. The gate pad 230h of FIG. 3 and the dummy pattern formed in the gate pad are described. The gate pad 230h of FIG. 3 is positioned on the outermost area of the active area 210, and applies a signal to the gate line (e.g., sensing line and scanning line). Meanwhile, the gate pad 230h of FIG. 3 is positioned on the outermost area of the active area 210. The transistor 610 is formed in the active area 210 on the line 311 which is positioned on the outermost area, among the lines forming the outermost gate pad 230h. In addition, in order to protect the transistor 610 in the active area 210, the dummy transistor 710 may be further formed in a shape identical to or similar to that of the transistor 610 of the outermost line 311.

As described above with reference to FIGS. 6 and 8, an end of the dummy pattern may extend to the outside of the pad area and may be disposed on the outside of the active area. The dummy pattern is disposed in parallel with the most adjacent data line or gate line. The dummy pattern prevents an occurrence of static electricity in a gate line or a data line when friction occurs from the outside of the active area to the inside of the active area during processing of a product or after the product is released. The dummy pattern prevents static electricity damage which may occur in pixels, specially, in a thin film transistor of the active area, and thus increases stability of a display device or a display panel.

As described above with reference to FIGS. 7 and 9, in the dummy pattern, the dummy thin film transistor which has a structure of a thin film transistor and does not control a pixel may be disposed. A plurality of thin film transistors connected to a gate line or a data line of the active area are disposed in a row. A possibility in which a thin film transistor connected to a gate line or a data line which is positioned on the edge of the active area is damaged due to static electricity is high. Therefore, in order to protect the thin film transistor connected to the gate line or the data line which is positioned on the edge, the dummy thin film transistor having a structure identical to that of the thin film transistor of the active area is disposed in the dummy pattern of the pad. Therefore, static electricity due to friction is induced to the dummy pattern, and thus the thin film transistor in the active area can be protected.

Figure 10:
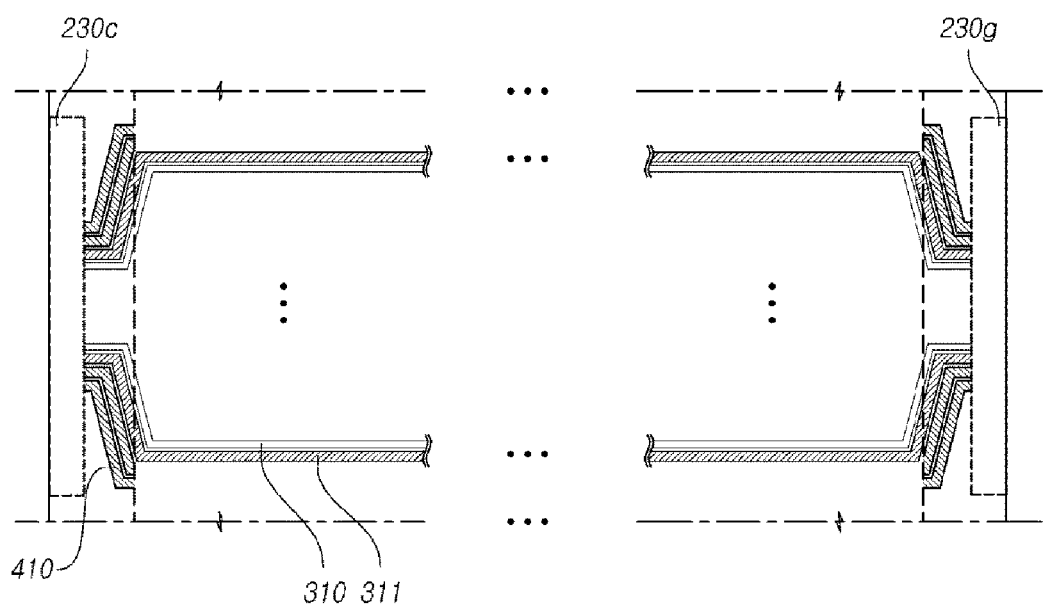
FIG. 10 is a view illustrating a dummy pattern formed in a central pad area according to an embodiment of the present invention.

FIG. 10 is a view illustrating a dummy pattern formed in a central pad area according to an embodiment of the present invention. The gate pads 230c and 230g of FIG. 2 and the dummy pattern formed in the gate pad are described. The gate pads 230c and 230g of FIG. 2 face each other, and apply a signal to the same gate line (e.g., sensing line and scanning line). Meanwhile, the gate pads 230c and 230g of FIG. 2 are positioned on a central area of the active area 210. Thus, the dummy pattern 410 is only formed outside of the active area 210.

Figure 11:
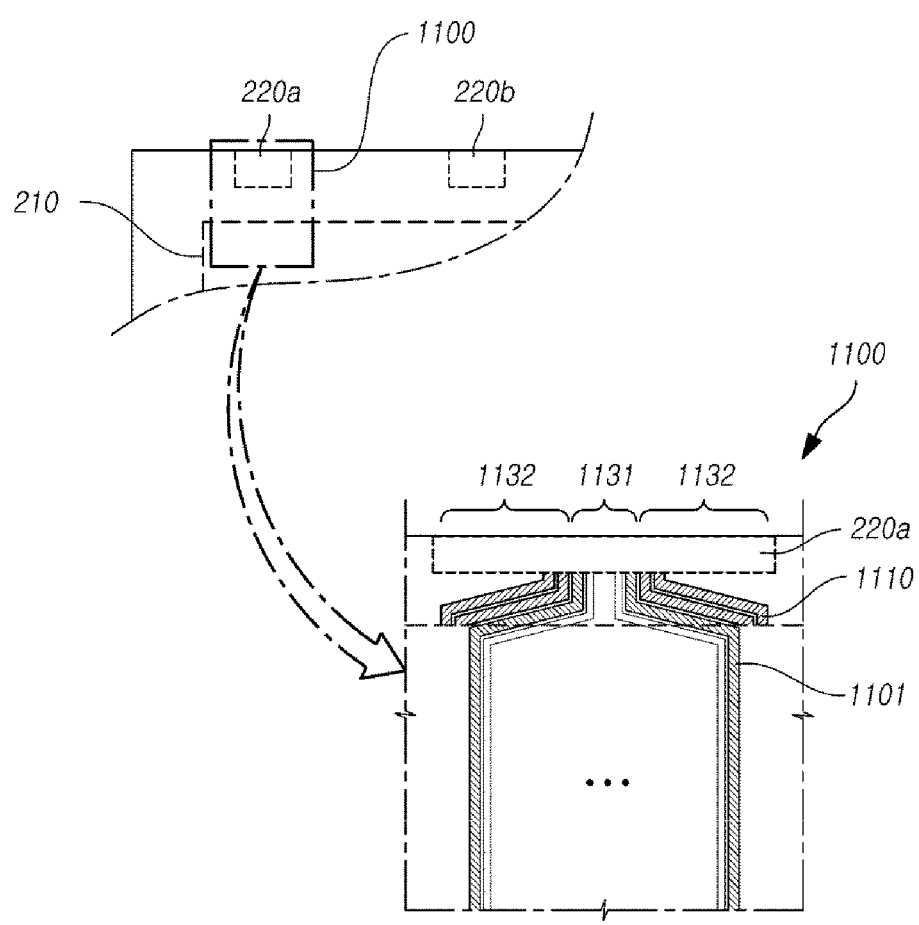
FIG. 11 is a view illustrating a dummy pattern formed in a data pad area according to an embodiment of the present invention.

FIG. 11 is a view illustrating a dummy pattern formed in a data pad area according to an embodiment of the present invention.

In the data pad area, similarly to the above-mentioned gate pad, a dummy pattern is disposed between a signal area and a non-signal area. Referring to an enlarged view of a portion 1100 in a data pad 220a, a data line 1101 is formed in a signal area 1131 of the data line 1101, and the dummy pattern 1110 is formed between the signal area 1131 and the non-signal area 1132 which is the outside of the signal area 1131. Therefore, when friction occurs from the non-signal area 1132 to the signal area 1131 of the data pad, since static electricity occurs in the dummy pattern 1110, static electricity is blocked from occurring in the data pad. As described related to the gate pad, the dummy pattern of the data pad may also be variously formed, and the dummy pattern may apply the configuration of FIGS. 6 to 10. However, when the gate pads are positioned on both sides, the outermost dummy pattern of the data pad which is the positioned on the most outer area does not extend lengthily. According to an embodiment, only the left gate pads 230a to 230d of FIG. 2 or FIG. 3 are disposed, and the outermost dummy pattern of the outermost data pad 220e may extend to the outside of the active area as shown in FIGS. 6 to 9.

Figure 12:
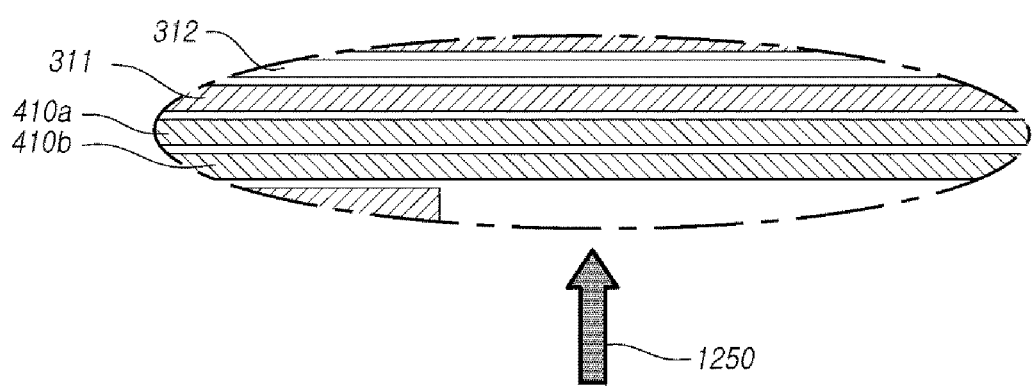
FIG. 12 is a view illustrating a structure of a dummy pattern when two or more dummy patterns according to an embodiment of the present invention are disposed.

FIG. 12 is a view illustrating a structure of a dummy pattern when two or more dummy patterns according to an embodiment of the present invention are disposed. FIG. 12 is an enlarged view of a portion 1200 in FIG. 5.

Both of the dummy patterns 410a and 410b have a pattern identical to that of the line 311. Therefore, static electricity due to friction occurring in the non-signal area in a direction 1250 and a difference of patterns initially occurs in the dummy pattern 410b and then occurs in the dummy pattern 410a. Therefore, the line 311 of the signal area is securely protected. The dummy pattern 410a most adjacent to the outermost line of the signal line is disposed in a pattern equal to or similar to the line 311, and thus the dummy pattern 410a can protect the line 311. The equality or similarity of the pattern in the line may refer to the equality or similarity of the width of the line. In addition, when the width of the line becomes wider or narrower in a regular interval, the equality or similarity of the pattern in the line may refer to a reflection of properties or some of the interval. Therefore, the width of the dummy pattern 410a may be equal to or similar to that of the most outer line 311.

Figure 13:
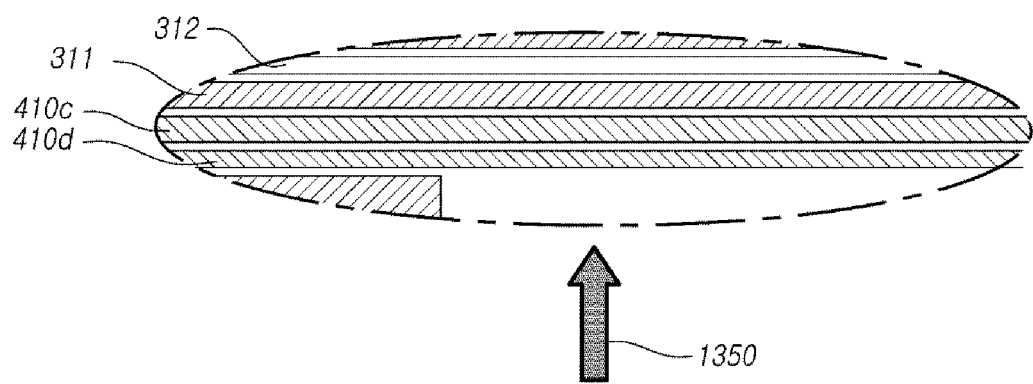
FIG. 13 is a view illustrating a structure of a dummy pattern when two or more dummy patterns according to another embodiment of the present invention are disposed.

FIG. 13 is a view illustrating a structure of a dummy pattern when two or more dummy patterns according to another embodiment of the present invention are disposed. FIG. 13 is an enlarged view of a portion 1200 in FIG. 5. A dummy pattern 410c which is most adjacent to the most outer line 311 of the signal area, among dummy patterns 410c and 410d may be formed identically to or similarly to that of the outermost line 311. Meanwhile, the dummy pattern 410d farther from the signal area compared to the other dummy pattern 410c may not be identical to the outermost line 311. That is, the width of the dummy pattern 410d may be narrower than that of the line 311. According to another embodiment, the width of the dummy pattern 410d may be identical to that of the line 312. That is, when a sensing line and a scanning line are alternately positioned like the gate pad and the line 311 of the signal area, which is positioned on the outermost area is the sensing line, the dummy pattern 410c which is most adjacent to the line 311 may be disposed with a pattern identical to that of the sensing line. In addition, when the other line 312 is the scanning line, the dummy pattern 410d may be disposed with a pattern identical to that of the scanning line.

To sum up, the dummy pattern has a pattern identical to or similar to that of the line which is most adjacent to the non-signal area, among the lines of the signal area. Therefore, when friction occurs from the non-signal area to the signal area, static electricity which may occur in the outermost line of the signal area occurs in the dummy pattern. Thus, the dummy pattern prevents damage to the outermost line of the signal area and a thin film transistor connected to the outermost line.

In addition, when two or more dummy patterns are disposed, all of the dummy patterns may be formed in the pattern identical to or similar to the pattern of the line which is most adjacent to the non-signal area, among the lines of the signal area. However, when a pattern in the lines of the signal area is not one pattern, that is, when the second line 312, the first line 311, the first dummy pattern 410c and the second dummy pattern 410d are sequentially disposed as shown in FIG. 13, the first line 311 and the first dummy pattern 410c may be disposed in the same or similar shape, and the second line 312 and the second dummy pattern 410d may be disposed in the same or similar shape. That is, the first dummy pattern 410c may be more similar to the first line 311 compared to the second dummy pattern 410d. When two or more dummy patterns are disposed, a shape of a dummy pattern more closely disposed on the signal area is more similar to the line of the signal area, and thus an occurrence of static electricity is minimized. Accordingly, stability can be increased such that static electricity does not occur even in the dummy pattern adjacent to the signal area.

In an embodiment of the present invention, a dummy pattern is disposed outside of a signal area of a gate pad or a data pad. Therefore, a defect of a thin film transistor due to a static electricity is removed, and thus a performance of a display device can be improved.

Further, the terms "includes", "constitutes", or "has" mentioned above mean that a corresponding structural element is included unless they have no reverse meaning. Accordingly, it should be interpreted that the terms may not exclude but further include other structural elements. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

The description and the attached drawings are provided only to exemplarily describe the technical spirit of the present invention, and it will be appreciated by those skilled in the art to which the present invention pertains that the present invention may be variously corrected and modified, for example, by coupling, separating, replacing, and changing the elements. Accordingly, the embodiments disclosed in the present invention are merely to not limit but describe the technical spirit of the present invention. Further, the scope of the technical spirit of the present invention is not limited by the embodiments. The scope of the present invention shall be construed on the basis of the accompanying claims in such a manner that all of the technical ideas included within the scope equivalent to the claims belong to the present invention.

What is claimed is:

1. A display device comprising:
    a display panel that includes an active area, the active area including a data line positioned on a substrate in a first direction and transferring a data signal, a gate line positioned on the substrate in a second direction and transferring a gate signal, a thin film transistor connected to the gate line and the data line, and a plurality of pixels driven by the thin film transistor;
    a first pad coupled to a first signal line disposed in a data signal area where signal lines connected to the data line are disposed, the first pad further coupled to a first non-signal line disposed in a first non-signal area where lines disconnected from the data line are disposed, the first non-signal area being disposed outside the data signal area;
    a second pad coupled to a second signal line disposed in a gate signal area where signal lines connected to the gate line are disposed, the second pad further coupled to a second non-signal line disposed in a second non-signal area where lines disconnected from the gate line are disposed, the second non-signal area being disposed outside the gate signal area; and
    a dummy pattern disposed between the data signal area and the first non-signal area, and disposed between the gate signal area and the second non-signal area.

2. The display device of claim 1, wherein the dummy pattern is a pattern identical to or similar to a pattern of a signal line disposed outermost in the gate signal area.

3. The display device of claim 2, wherein the signal line disposed outermost in the gate signal area, a first dummy pattern and a second dummy pattern comprised by the dummy pattern are sequentially disposed, and the first dummy pattern is more similar to the signal line compared to the second dummy pattern.

4. The display device of claim 1, wherein an end of the dummy pattern extends to an outside of the first pad or the second pad, and is disposed on the outside of the active area in the first direction or the second direction.

5. The display device of claim 4, wherein the display device further comprises a dummy thin film transistor disposed on the dummy pattern and having a structure identical to a thin film transistor connected to the gate line or the data line of the active area, which is most adjacent to the dummy pattern.

6. The display device of claim 1, wherein the gate line is a sensing line connected to a sensing thin film transistor or a scanning line connected to a driving thin film transistor.

7. The display device of claim 1, wherein a width of the dummy pattern is narrower than a width of the first signal line connected to the data line.

8. A display panel comprising:
    an active area that includes a data line positioned on a substrate in a first direction and transferring a data signal, a gate line positioned on the substrate in a second direction and transferring a gate signal, a thin film transistor connected to the gate line and the data line, and a pixel area driven by the thin film transistor;
    a data pad coupled to a first signal line disposed in a data signal area where signal lines connected to the data line are disposed, the data pad further coupled to a first non-signal line disposed in a first non-signal area where lines disconnected from the data line are disposed, the first non-signal area being disposed outside the data signal area;

a gate pad coupled to a second signal line disposed in a gate signal area where signal lines connected to the gate line are disposed, the gate pad further coupled to a second non-signal line disposed in a second non-signal area where lines disconnected from the gate line are disposed, the second non-signal area being disposed outside the gate signal area; and a dummy pattern disposed between the data signal area and the first non-signal area, and disposed between the gate signal area and the second non-signal area.

9. The display panel of claim 8, wherein the dummy pattern is a pattern identical to or similar to a pattern of a signal line disposed outermost in the gate signal area.

10. The display panel of claim 9, wherein the signal line disposed outermost in the gate signal area, a first dummy pattern and a second dummy pattern comprised by the dummy pattern are sequentially disposed, and the first dummy pattern is more similar to the signal line compared to the second dummy pattern.

11. The display panel of claim 8, wherein an end of the dummy pattern extends to an outside of the data pad or the gate pad, and is disposed on the outside of the active area in the first direction or the second direction.

12. The display panel of claim 11, further comprising a dummy thin film transistor disposed on the dummy pattern and having a structure identical to a thin film transistor connected to the gate line or the data line of the active area, which is most adjacent to the dummy pattern.

13. The display panel of claim 8, wherein the gate line is a sensing line connected to a sensing thin film transistor or a scanning line connected to a driving thin film transistor.

14. The display panel of claim 8, wherein a width of the dummy pattern is narrower than a width of the first signal line connected to the data line.

15. The display panel of claim 8, wherein the first non-signal area of the data pad is located outside of the signal area of the data pad.

16. The display panel of claim 8, wherein the second non-signal area of the gate pad is located outside of the signal area of the gate pad.

\* \* \* \* \*